United States Patent [19]

Terada et al.

[11] Patent Number: 4,635,131
[45] Date of Patent: Jan. 6, 1987

[54] METHOD OF AND APPARATUS FOR PRODUCING HALFTONE DOT FILM OF GRADATED DENSITY DISTRIBUTION

[75] Inventors: Shinichi Terada, Toyonaka; Kozo Masuda, Ashiya; Yoshimitsu Adachi, Osaka, all of Japan

[73] Assignees: D. S. Scanner Co., Ltd., Osaka; Dainippon Screen Mfg. Co., Ltd., Kyoto, both of Japan

[21] Appl. No.: 785,711

[22] Filed: Oct. 9, 1985

[30] Foreign Application Priority Data

Oct. 11, 1984 [JP] Japan ................................. 59-214600

[51] Int. Cl.$^4$ .......................... H04N 1/21; H04N 1/40
[52] U.S. Cl. .................................... 358/296; 358/298; 358/280; 358/283
[58] Field of Search ................ 364/518, 519; 358/296, 358/298, 280, 283, 75, 80, 285

[56] References Cited

FOREIGN PATENT DOCUMENTS

| 1493924 | 11/1977 | United Kingdom | 358/296 |
| 2026283 | 1/1980 | United Kingdom | 358/296 |
| 2133948 | 8/1984 | United Kingdom | 358/296 |
| 2157119 | 7/1985 | United Kingdom | 358/296 |

Primary Examiner—Harold Broome
Assistant Examiner—Linda M. Peco
Attorney, Agent, or Firm—Lowe Price LeBlanc Becker & Shur

[57] ABSTRACT

In an electronic image reproduction system, a halftone dot film of a density distribution of a specific pattern is produced by obtaining a value l expressed by an equation $l=f(x)+g(y)$ representative of the specific pattern corresponding to the density value. By superimposing a density signal corresponding to the value l on an image signal developed by scanning an original, a reproduction image of the original, modulated by the density signal of a specific pattern, is obtained.

16 Claims, 31 Drawing Figures

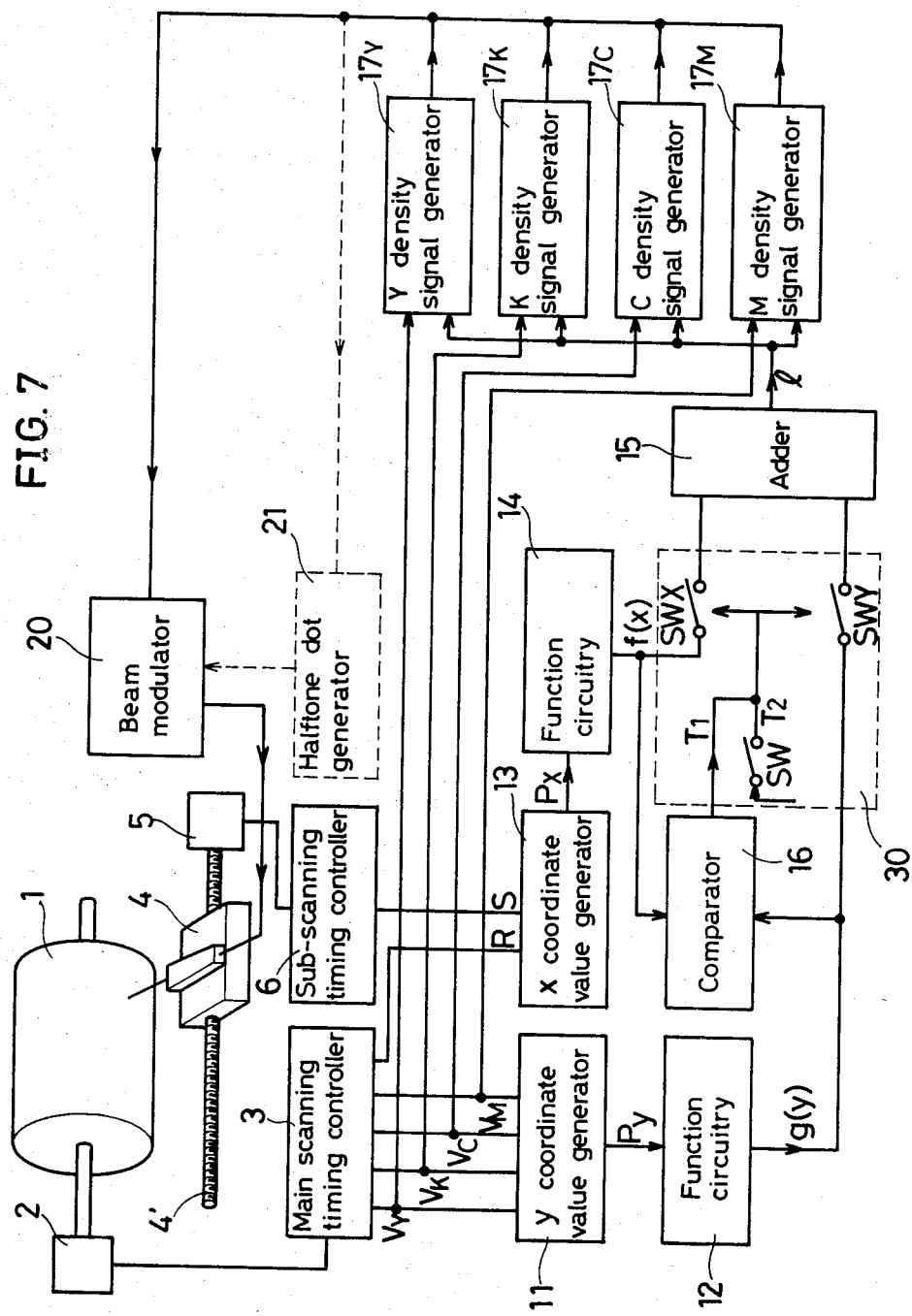

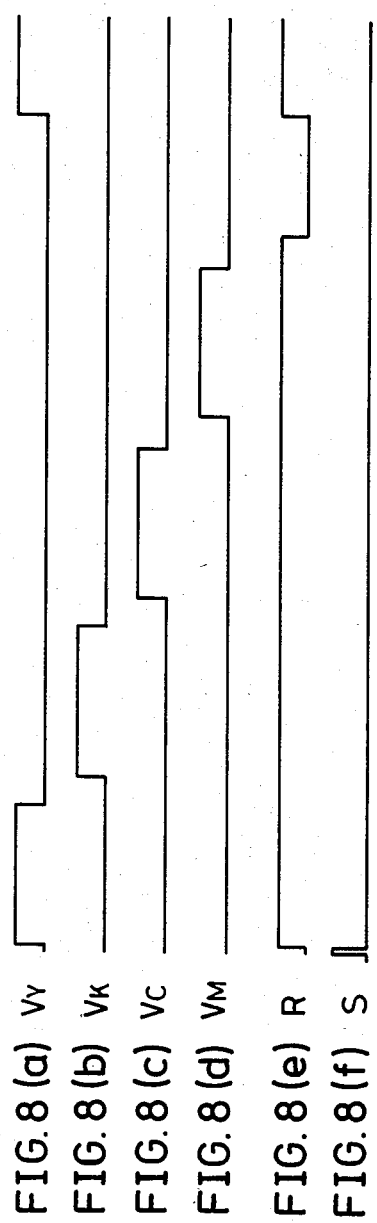
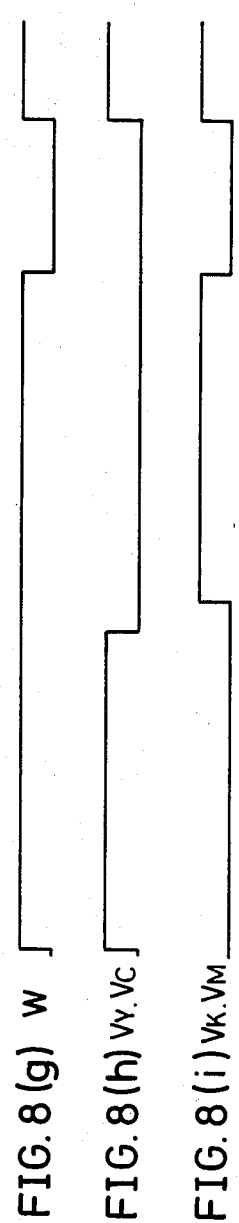
FIG.8(a) V_Y
FIG.8(b) V_K
FIG.8(c) V_C
FIG.8(d) V_M
FIG.8(e) R
FIG.8(f) S
FIG.8(g) W
FIG.8(h) V_Y,V_C
FIG.8(i) V_K,V_M 4,635,131

METHOD OF AND APPARATUS FOR PRODUCING HALFTONE DOT FILM OF GRADATED DENSITY DISTRIBUTION

FIELD OF THE INVENTION

The present invention relates generally to a method of and system for producing a halftone dot film of gradated density distribution, and more particularly to a computer based method and system for producing halftone dot film of any of a number of different gradated density distributions.

BACKGROUND OF THE INVENTION

There has been industrial demand for production of colored prints of gradated density distribution. To satisfy this demand, at least one halftone dot film of gradated density distribution must be provided for each of the color separations Y (Yellow), K (Black), C (Cyan) and M (Magenta) of a print. In producing such halftone dot film, a monochrome film of a gradated density distribution (a gradation master) has been used.

More precisely, an image signal obtained by scanning a gradation master provided as an original is exposed to a color correction process to be used for producing a mono-color halftone dot film of gradated density distribution. Then, a print of a desired color or density distribution is obtained by using such films produced for no fewer than two of the color separations Y, K, C and M.

However, because this method is applicable only to density gradation of one (lengthwise or sidewise) direction of a recording film, restricted by the gradation master, the method cannot be applied to form a density distribution pattern such as a concentric circle. In addition, the method is inconvenient because, using it, the degree of density gradation cannot be freely adjusted.

Therefore, a print of only a limited color or density gradation pattern can be obtained by any combination of halftone dot films of Y, K, C and M in the prior art.

SUMMARY OF THE INVENTION

Accordingly, it is an object of the present invention to provide a method of and system for electronically producing a halftone dot film whose density gradation is equivalent to that of a conventional gradation master.

Another object of the present invention is to provide a method of and apparatus for forming a halftone dot film of a density gradation corresponding to a specific pattern.

A further object of the present invention is to provide a method of and apparatus for producing a reproduction image modulated by a specific density distribution pattern by superimposing a signal representative of the specific pattern onto a signal obtained by scanning an original.

In order to implement the above objects, the present invention employs the following technique.

When the functions $f(x)=a|x-x_0|$, where $(a>0)$, and $g(y)=0$ are incorporated in an equation $$l=f(x)+g(y) \qquad (1)$$

the value of l represents a lengthwise fringe. In the same way, the value is capable of representing a rhombus by incorporating in equation (1) the functions $f(x)=a|x-x_0|$, where $(a>0)$, and $g(y)=b|y-y_0|$, where $(b>0)$, a circle or oval by $f(x)=a(x-x_0)^2$, where $(a>0)$ and $g(y)=b(y-y_0)^2$, where $(b>0)$ and a parabola by $f(x)=a(x-x_0)^2$, where $(a>0)$ and $g(y)=b|y-y_0|$, where $(b>0)$.

A rectangle can be expressed by taking the greater value l of two equations defining f(x) and g(y) representative of lengthwise and sidewise fringes.

Therefore, by making the value l (called the "mediate value") correspond to a density value, a halftone dot film of a specific density distribution pattern can be formed.

In practice, at first the x (sub-scanning) direction and y (main scanning) direction coordinate values on a recording material are obtained and then the values of the functions f(x) and g(y) expressive of a setup density distribution pattern corresponding respectively to the x and y coordinate values are computed.

It should be noted in this regard that the values of the functions f(x) and g(y) can be obtained by storing possible values of the functions in a data storage means, such as a RAM, through computation by an analog or digital computer or other apparatus.

By summing the values of the functions f(x) and g(y) in an adder, the mediate value l can be obtained. In the particular case of forming a rectangle density distribution pattern, the greater one of the values of the functions f(x) and g(y) is adopted.

Then, a density distribution pattern corresponding to the variation of the mediate value l is obtained. According to the density distribution pattern, a halftone dot film is directly produced or the signal representing the pattern is superimposed onto a signal obtained by scanning an original.

It should be noted that the means for outputting a density signal corresponding to the above mediate value l can be embodied by analog circuitry or by memories storing possible density values addressed by the variation of the mediate value l for each of the color separations Y, K, C and M.

In accordance with the above-mentioned procedure, a halftone dot film of a desired density distribution pattern can be obtained which corrects the defects of the conventional gradation master that itself is capable of expressing only a density distribution pattern of one-directional gradation in the main or the sub-scanning direction. Therefore, by using such halftone dot films produced for each of the color separations in combination, a print with an image modulated by the adopted pattern can be reproduced.

The above and other objects and features of the present invention can be appreciated more fully from the following detailed description when read with reference to the accompanying drawings.

BRIEF DESCRIPTION OF THE DRAWINGS

FIG. 7 is a block diagram of an embodiment of the present invention.

FIGS. 8(a)-8(f) are waveforms of several signals employed in the embodiment of FIG. 7.

DETAILED DESCRIPTION OF A PREFERRED EMBODIMENT OF THE INVENTION

A specific figure of an orthogonal system (x, y) can be generally expressed by an equation:

$$l = f(x) + g(y) \quad (1).$$

Figure 1:
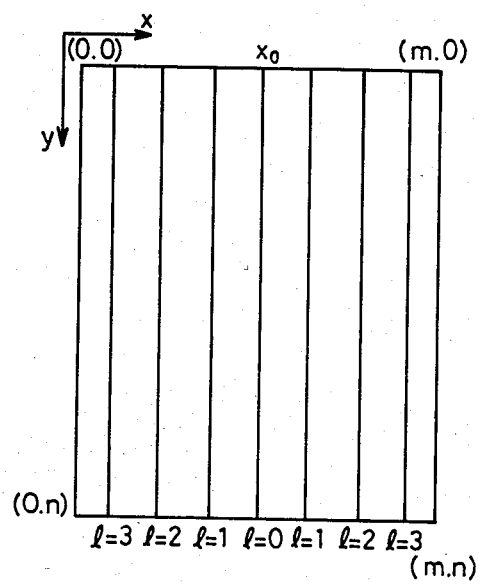
FIGS. 1(a) and 1(b) are density distribution patterns of lengthwise fringes.
FIG. 1(c) is a pattern of a sidewise fringe.
Figure 1:
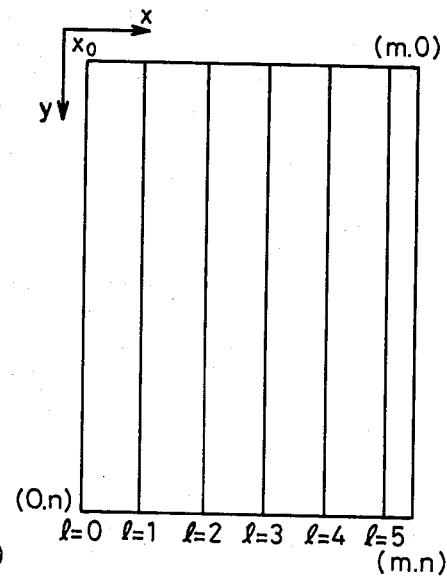
Figure 1:
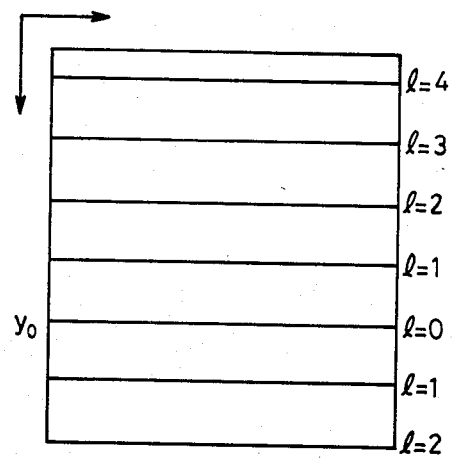
Figure 2:
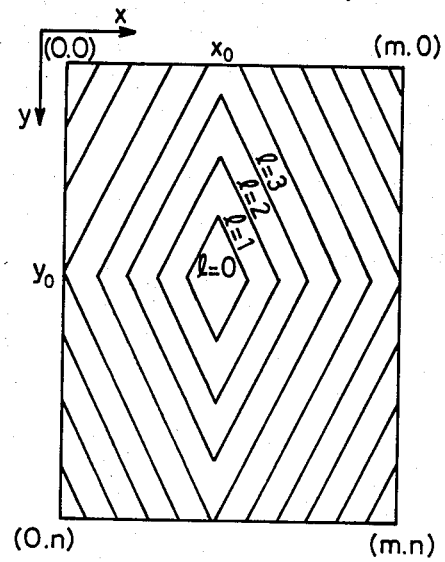
FIGS. 2(a) and 2(b) are density distribution patterns of a rhombus.
Figure 2:
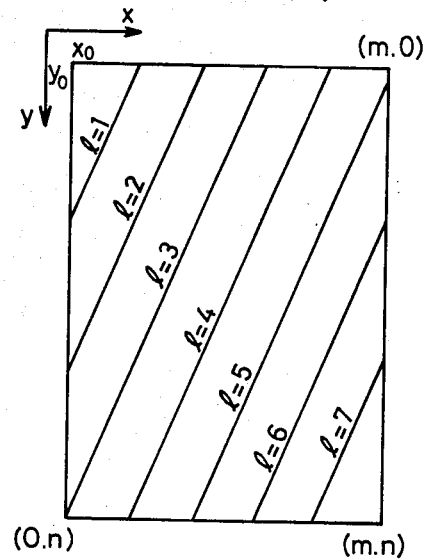
Figure 3:
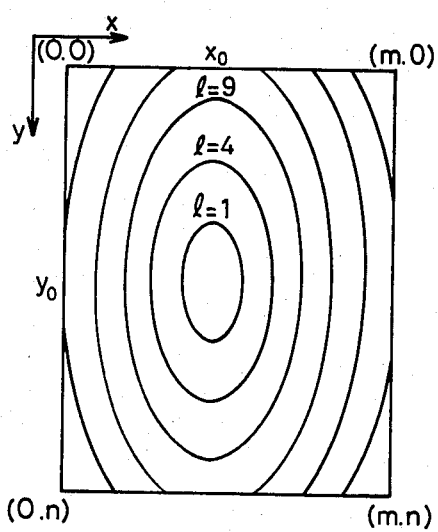
FIGS. 3(a) and 3(b) are density distribution patterns of an oval.
Figure 3:
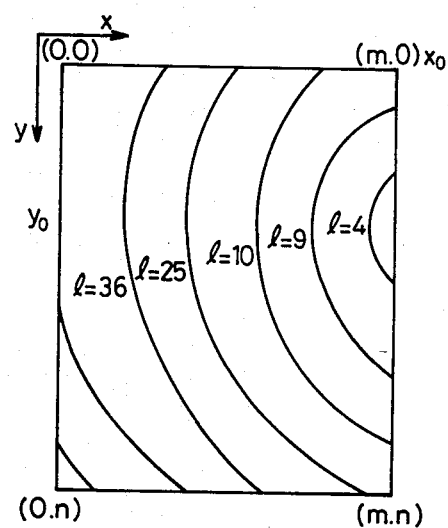
Figure 4:
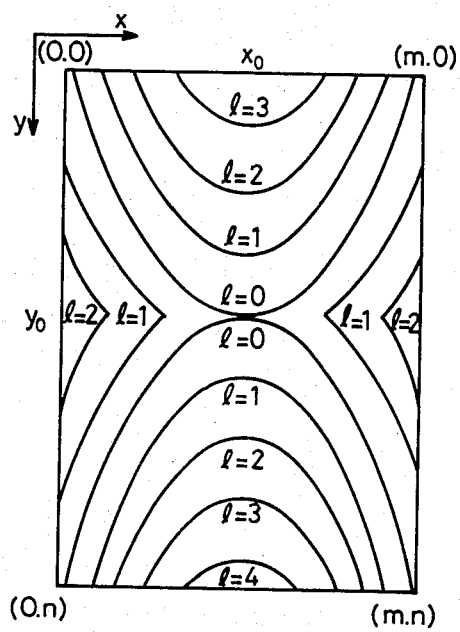
FIG. 4 is a density distribution pattern of a parabola.
Figure 5:
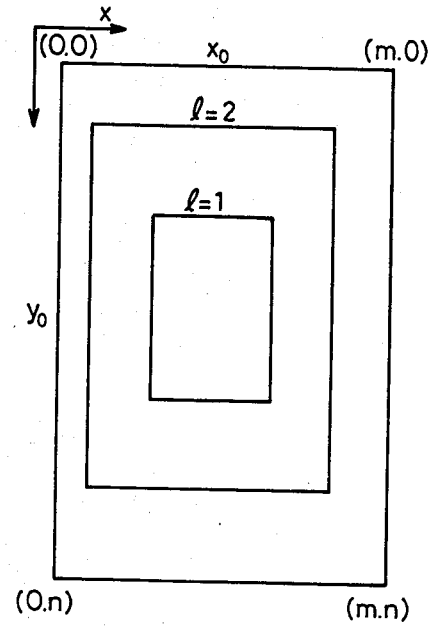
FIG. 5 is a density distribution pattern of a rectangle.
Figure 6:
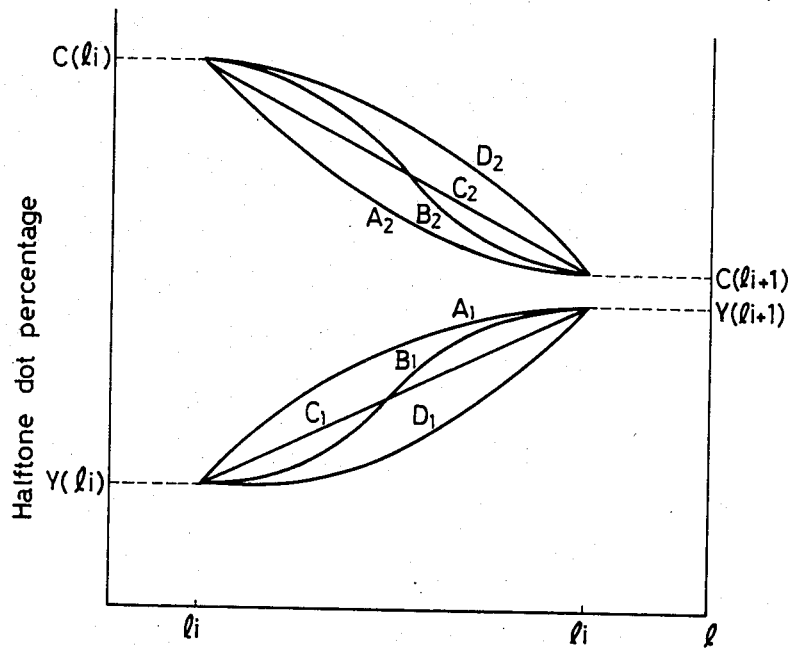
FIG. 6 is a graph of several characteristic curves between the mediate value l and the corresponding halftone dot percentage.

When the value is assumed as a "mediate" value, the equation (1) may be applied to express density distribution patterns as shown in FIGS. 1 through 5, wherein the intervals between adjoining density contours correspond to the degree of variation of the mediate value l, as shown by several characteristic curves in FIG. 6.

FIGS. 1 through 5 represent several density distribution patterns. It is now assumed that four corners of the frame of each of FIGS. 1 through 5 have coordinate values (0, 0), (m, 0), (0, n) and (m, n), and the point (0, 0) is the common origin for y (main scanning) and x (sub-scanning) directions on recording film mounted on a recording drum of an image reproduction system of a type to be hereinafter described.

(I) A FRINGE DENSITY DISTRIBUTION PATTERN PRODUCING MODE

Assuming $f(x) = a|x - x_0|$ and $g(y) = 0$, the equation (1) is expressed as:

$$l = a|x - x_0| \quad (2).$$

Since equation (2) can be expressed as $x = x_0 \pm (l_K/a)$ with respect to a specific value $l_K$ (K: 0 to m) of the mediate value l, equation (2) corresponds to a density distribution pattern of a lengthwise fringe in the x direction that is symmetrical about an axis $X = X_0$, as shown in FIG. 1(a). By setting the value $X_0$ to be equal to or less than zero ($X_0 \leq 0$), a density distribution pattern as shown in FIG. 1(b) can be obtained, in which the density value varies only in the positive direction of the mediate value l.

A density distribution pattern as shown in FIG. 1(a) or 1(b) can also be formed in the y direction as shown in FIG. 1(c) according to equations $f(x) = 0$ and $g(y) = -b|y - y_0|$.

(II) A RHOMBUS DENSITY DISTRIBUTION PATTERN PRODUCING MODE

Assuming $f(x) = a|x - x_0|$, where (a>0) and $g(y) = -b|y - y_0|$, where (b>0), the equation (1) is expressed as:

$$l = f(x) + g(y) = a|x - x_0| + b|y - y_0| \quad (3).$$

The equation (3), representing a rhombus pattern comprising four vertices at $(x_0 + (l_K/a), y_0)$, $(x_0 - (l_K/a), y_0)$, $(x_0, y_0 + (l_K/b))$ and $(x_0, y_0 - (l_K/b))$ with respect to a specific value $l_K$ (K: 0 to m) of the mediate value l, corresponds to a density distribution pattern as shown in FIG. 2(a) in which the center of the rhombus is at $(x_0, y_0)$.

FIG. 2(b) shows such a rhombus density distribution pattern having its center $(x_0, y_0)$ set at the origin (0, 0). As is obvious from the pattern of FIG. 2(b), the gradation direction of the density can be changed.

(III) A CIRCLE OR OVAL DENSITY DISTRIBUTION PATTERN PRODUCING MODE

Assuming $f(x) = a(x - x_0)^2$, where (a>0) and $g(y) = -b(y - y_0)^2$, where (b>0), equation (1) is expressed as:

$$l = a(x - x_0)^2 + b(y - y_0)^2 \quad (4).$$

The equation (4), representing an oval pattern comprising two axes $2\sqrt{l_K/a}$ and $2\sqrt{l_K/b}$ (either can be longer than the other) with respect to a specific value $l_K$ (K: 0 to n), corresponds to a density distribution pattern as shown in FIG. 3(a) in which the center of the oval is at $(x_0, y_0)$.

FIG. 3(b) shows the above oval density distribution whose center is set at outside the frame ($x_0 > m$, $0 < y_0 < n$) of FIG. 3(b). It is obvious in this regard that the equation (4) can represent a circle density distribution pattern where a = b.

(IV) A PARABOLA DENSITY DISTRIBUTION PATTERN PRODUCING MODE

Assuming $f(x) = a(x - x_0)^2$, where (a>0) and $g(y) = -b|y - y_0|$, where (b>0), equation (1) is expressed as:

$$l = a(x - x_0)^2 + b|y = y_0| \quad (5).$$

The equation (5), representing a parabola pattern comprising an axis $X = X_0$ with respect to a specific value $l_K$ (K: 0 to n) of the mediate value l, corresponds to a density distribution pattern as shown in FIG. 4 in which the vertex of the parabola is at $(x_0, y_0 \pm (l_K/b))$.

By setting the value $y_0$ to be equal to or less than zero ($y \leq 0$) or equal to or greater than n ($y \geq n$), a one-sided parabola density distribution pattern can be obtained.

(V) A RECTANGULAR DENSITY DISTRIBUTION PATTERN PRODUCING MODE

Assuming $f(x) = a|x - x_0|$, where (a>0) and $g(y) = 0$, equation (1) is expressed as:

$$l = a|x - x_0| \quad (6').$$

Meanwhile assuming $f(x) = 0$ and $g(y) = b|y - y_0|$, where (b>0), equation (1) is expressed as:

$$l = b|y - y_0| \quad (6'').$$

By taking the greater value of the equations (6') and (6"), a density distribution pattern as shown in FIG. 5 corresponds to a rectangle comprising corners situated at $$\left(x_0 + \frac{l_K}{a}, y_0 + \frac{l_K}{b}\right), \left(x_0 + \frac{l_K}{a}, y_0 = \frac{l_K}{b}\right),$$

$$\left(x_0 - \frac{l_K}{a}, y_0 + \frac{l_K}{b}\right) \text{ and } \left(x_0 - \frac{l_K}{a}, y_0 - \frac{l_K}{b}\right)$$

with respect to a specific value $l_K$ (K: 0 to n) of the mediate value l can be obtained. When a=b, the density distribution pattern is a square.

In each density distribution pattern producing mode, density values (halftone dot percentage in the present invention) corresponding to possible values of the mediate value can be prepared beforehand. FIG. 6 shows several characteristic curves between the mediate value l (horizontal axis) and the halftone dot percentage (vertical axis). As shown in FIG. 6, the density value can be increased with an increase of the mediate value l as shown by the characteristic curves $A_1$, $B_1$, $C_1$ and $D_1$ in FIG. 6. On the other hand, the density value can be decreased with an increase of the mediate value l as shown by the characteristic curves $A_2$, $B_2$, $C_2$ and $D_2$ in FIG. 6. As regards the characteristic curves, the density value can be varied in proportion to the mediate value l as shown by the characteristic curve $C_1$ or $C_2$, or along a curve as shown by the curve $A_1$, $B_1$, $D_1$, $A_2$, $B_2$ or $D_2$. In this respect, the curve to be selected depends on desired density gradation and color variation as mentioned hereinbelow.

FIG. 7 is a schematic diagram of a circuit of the present invention employed in an image reproducing system, and FIG. 8 is a timing diagram of signals employed in the circuit.

The output of a rotary encoder 2 by a recording drum 1 is applied to a main scanning timing controller 3. The timing controller 3 develops a recording signal R as shown in FIG. 8(e) which becomes "H" (High) at a recording start point of rotation of the recording drum and beomes "L" (Low) at a recording stop point of the same. The signal R is supplied to a y coordinate value generator 11 mentioned below. The timing controller 3 also supplies the y coordinate value generator 11 color separation recording signals $V_Y$, $V_K$, $V_C$ and $V_M$ for indicating which one of color separations Y (Yellow), K (Black), C (Cyan) and M (Magenta) is presently recorded. Each of the color separation recording signals $V_Y$, $V_K$, $V_C$ and $V_M$ is a signal which becomes "H" when the corresponding color separation (for instance, $V_Y$ for Y color separation) is being recorded. In the meantime, a subscanning timing controller 6 outputs, to an x coordinate value generator 13 mentioned below, a recording start pulse signal S by processing an output signal of a rotary encoder 5 rotated by a feed screw 4' along which a recording head 4 is fed.

The y coordinate value generator 11 generates a y coordinate value signal $P_y$ corresponding to the main scanning position of the recording head 4 by processing the color separation recording signals $V_Y$, $V_K$, $V_C$ and $V_M$. The signal $P_y$ is supplied to a function circuit 12 which in turn generates a signal representing a function g(y) corresponding to the signal $P_y$.

In the same way, the x coordinate value generator 13 supplies to a function circuit 14 an x coordinate value signal $P_x$ corresponding to the sub-scanning position of the recording head 4 by processing the recording signal R and the recording start pulse signal S. The function circuit 14 generates a signal representing a function f(x) corresponding to the signal $P_x$.

The thus-obtained functions are summed in an adder 15 to produce a mediate value l. When a density distribution pattern such as shown in FIGS. 1 through 4 is to be obtained, by setting up desired functions f(x) and g(y) and closing a switch $S_W$ in a switching circuit 30, switches $S_{WX}$ and $S_{WY}$ become conductive to output the mediate value l from the adder 15. When a rectangular density distribution pattern such as shown in FIG. 5 is to be obtained, the values of the functions f(x) and g(y) are compared in a comparator 16 to make the switch $S_{WX}$ or $S_{WY}$ conductive, by which the greater value of the functions is output to the adder 15.

The mediate value l obtained by the adder 15 is input to density signal generators $17_Y$, $17_K$, $17_C$ and $17_M$ respectively for the color separations Y, K, C and M according to the selection operation of the signals $V_Y$, $V_K$, $V_C$ and $V_M$. Density signals output from the density signal generators $17_Y$, $17_K$, $17_C$ and $17_M$ are input to a beam modulator 20 to be used for controlling an exposure signal. In an image reproduction system comprising a halftone dot generator 21, the density signals are supplied to the generator.

Figure 9:
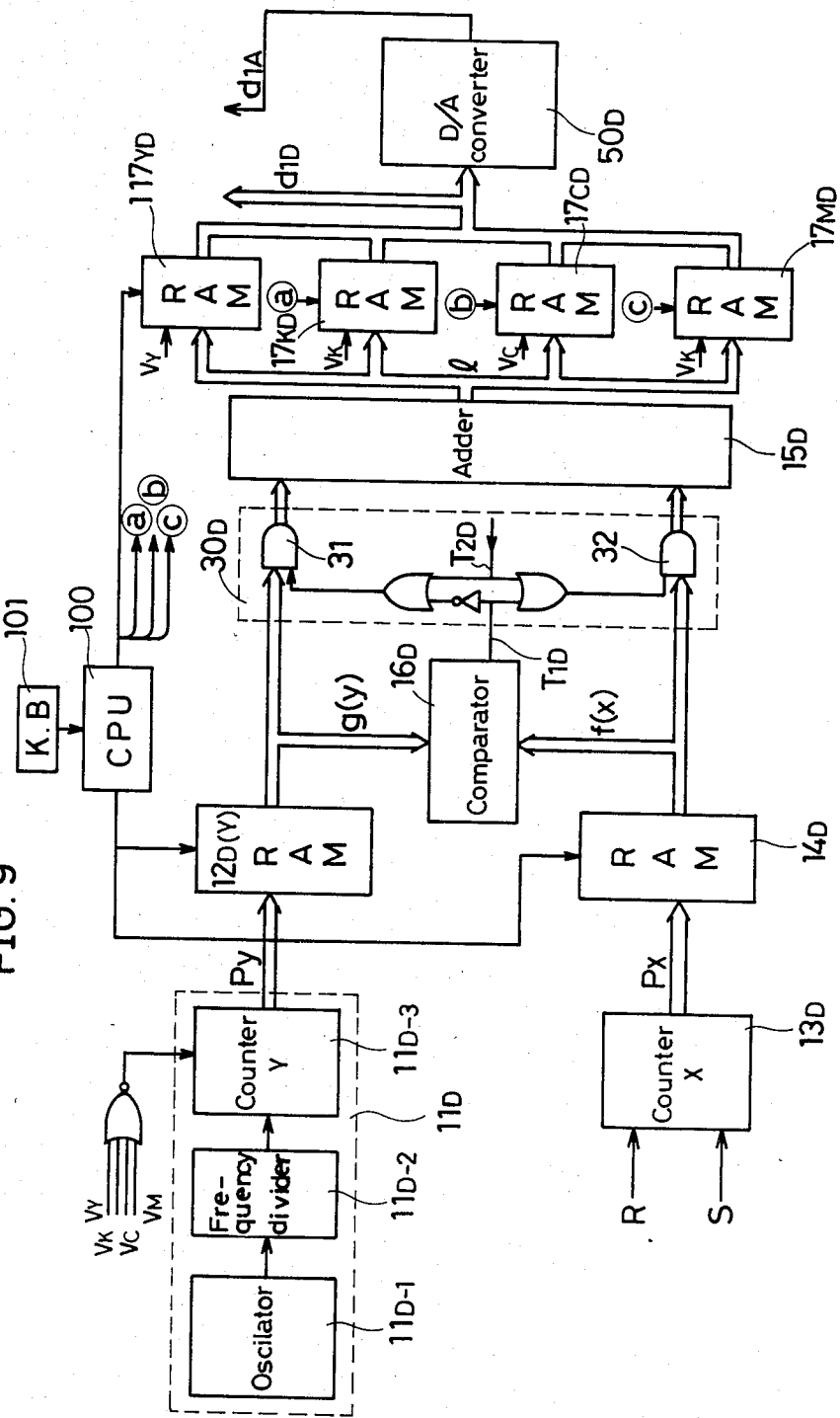
FIG. 9 is a block diagram of a digital data processing portion of the apparatus of FIG. 7.

FIG. 9 is a block diagram of an embodiment of the present invention. Since the embodiment of FIG. 9 is a digital version of the data processing part of the apparatus of FIG. 7, each component shown in FIG. 9 has the same number as its counterpart in FIG. 7 with a suffix D attached, by which the functional correspondency between the two is clarified. First, a signal obtained from an oscillator $11_{D-1}$ is input via a frequency divider $11_{D-2}$ to a counter $11_{D-3}$. The counter $11_{D-3}$ is cleared when the color separation recording signal $V_Y$, $V_K$, $V_C$ or $V_M$ becomes "L", and begins to count the frequency of the signal output from the frequency divider $11_{D-2}$ when the color separation signal becomes "H". The count number of the counter $11_{D-3}$ is to be a y coordinate value signal $P_y$ input to a RAM $12_D$ mentioned below.

There are stored in RAM $12_D$ values of a desired function g(y) with possible values of the signal $P_y$ being the RAM addresses. In this regard, the function g(y) corresponds to desired one of the density distribution patterns shown in FIGS. 1 through 5. Therefore, a value of the desired function g(y) is output in response to input to the RAM $12_D$ of the signal $P_y$.

On the other hand, a counter $13_D$ is cleared when the recording start pulse signal S indicative of the return of the recording head 4 to the recording start point is input thereto. Counter $13_D$ begins to count the frequency of the recording signal R indicative of revolution of the recording drum 4. The count number of the counter $13_D$ is to be an x coordinate value signal $P_x$ input to a RAM $14_D$, mentioned below.

Similar to ROM $12_D$, the ROM $14_D$ stores values of a desired function f(x) with possible values of the signal $P_x$ being the RAM addresses. In due course, a value of the function f(x) is output to the RAM $14_D$ in response to input of the signal $P_x$.

The values of the functions g(y) and f(x) are input to an adder $15_D$ respectively through AND-gates 31 and 32 of a switching circuit $30_D$.

The values of the functions g(y) and f(x) are also input to a comparator $16_D$. The comparator $16_D$ develops a selection signal $T_{1D}$ for controlling the switching circuitry $30_D$ which is "L" when the value of the function g(y) exceeds that of the function f(x).

The switching circuit $30_D$ is provided for controlling the AND-gates 31 and 32 to output the greater value of the functions f(x) and g(y) when a rectangle density distribution pattern is selected. Practically, the switching circuit $30_D$ outputs to the adder $15_D$ the value of the function g(y) when the selection signal $T_{1D}$ is "L", or the value of the function f(x) when the signal $T_{1D}$ is "H".

The values of the functions f(x) and g(y) are summed in the adder $15_D$ to produce a signal of a mediate value l.

The mediate value l is input to RAMs $17_{YD}$, $17_{KD}$, $17_{CD}$ and $17_{MD}$ as an address according to the selection operation of the signals $V_Y$, $V_K$, $V_C$ and $V_M$.

The RAMs $17_{YD}$, $17_{KD}$, $17_{CD}$ and $17_{MD}$ respectively store voltage data corresponding to specific density values in a manner mentioned below, and the voltage data are read into the RAMs in response to input of the mediate value l.

When a recording process is carried out using a contact screen, the digital voltage data are converted into a corresponding analog voltage data in a D/A converter $50_D$ before being input to the beam modulator 20. When the halftone dot generator 21 is used instead, the digital density voltage data are input directly to it.

Figure 10:
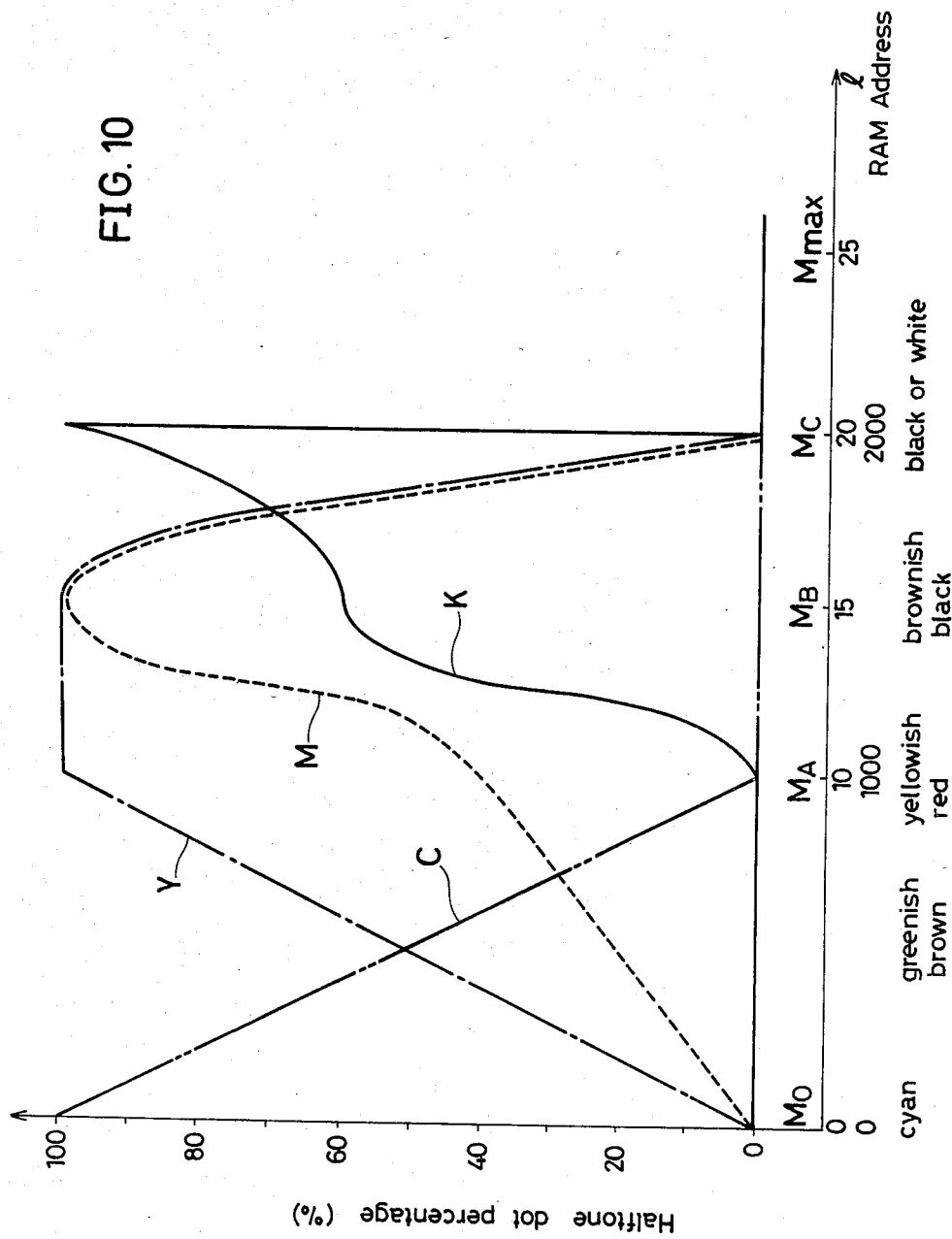
FIG. 10 is an example of density variations of Y, K, C and M color separations obtained by the apparatus of FIG. 9.

The following is a data input procedure to the RAMs $12_D$, $14_D$, $17_D$ ($17_{YD}$, $17_{KD}$, $17_{CD}$ and $17_{MD}$) of the apparatus of FIG. 9 for forming a color distribution on a print as shown in FIG. 10. Therein, an object image expressed by the equation (1) centered at $M_0(x_0, y_0)$ has colors changing from cyan, greenish brown, yellowish red, brownish black and white from points $M_A$, $M_B$, $M_C$ to $M_{max}$ in a specific direction (for instance, in the sub-scanning direction). It should be noted in this regard that the RAMs are all connected to a CPU 100, and necessary data are input from a keyboard 101 connected to the CPU.

Data input to the RAMs $12_D$ and $14_D$ is carried out as follows. First, the coordinate value of the point $M_0$ ($x_0$, $y_0$) [the coordinate values $x_0$ and $y_0$ represent lines when the density distribution patterns shown in FIGS. 1(a) and 1(b) are to be obtained] corresponding to the distance in the main and the sub-scanning directions from the recording start point, is input from the keyboard 101. Second, a desired density distribution pattern is designated, and then the coefficients a and b of the equations (2) and (6) are input. The CPU 100 computes the function f(x) corresponding to the value x (represented by the x coordinate value signal $P_x$ in the apparatus) according to the above input data and stores the computation result into the RAM $12_D$, with the value x being a storing address. In the same way, the CPU 100 computes the function g(y) corresponding to the value y (represented by the y direction coordinate value signal $P_y$ in the apparatus) and stores the computation result into the RAM $14_D$. It should be noted incidentally that the coefficients a and b can be determined such that one of them is fixed at zero while the other is variable.

Figure 11:
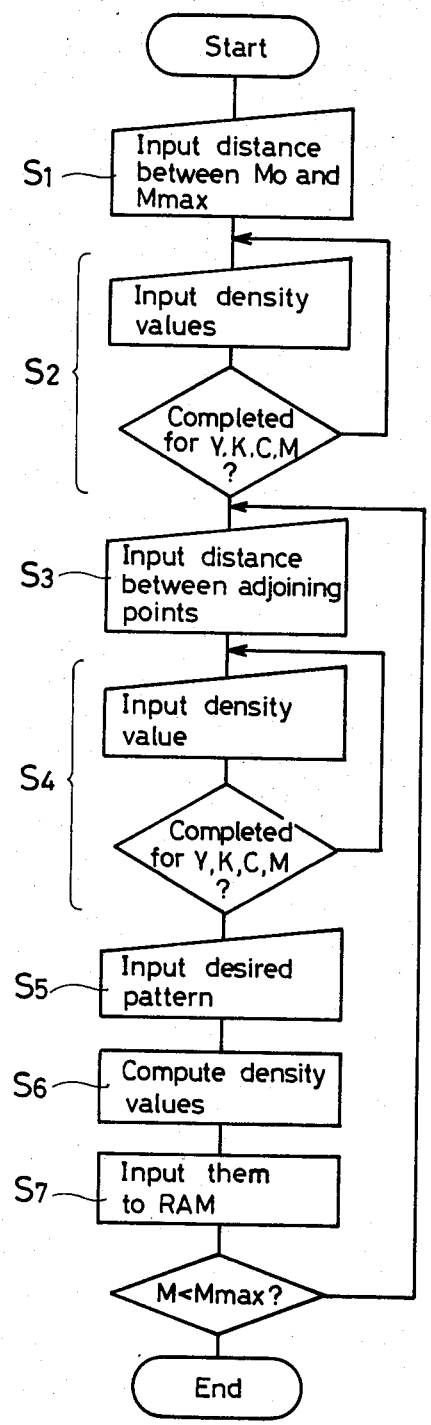
FIG. 11 is a flow chart of a data input procedure to the RAMs employed in the apparatus of FIG. 9.

FIG. 11 is a flow diagram describing the data input procedure to the RAMs $17_{YD}$, $17_{KD}$, $17_{CD}$ and $17_{MD}$. First, the distance between the points $M_0$ and $M_{max}$ representative of the maximum area of an object on which the said color variation is to be expressed is input (Step $S_1$). Second, the density value at the point $M_0$ of each of the color separations (in the said particular case, Y: 0%, M: 0% and C: 100%) is input (Step $S_2$). Third, the distance between the point $M_A$ at which the yellowish read color is to be shown and the point $M_0$ of the sub-scanning (or main scanning) direction factor is input (Step $S_3$). Then the densities at the point $M_A$ of the four color separations (in this particular case, Y: 100%, M: 40% and C: 0%) are input (Step $S_4$). After that, a desired one of the density distribution curves $A_1$, $B_1$, $C_1$, $D_1$, $A_2$, $B_2$, $C_2$ and $D_2$ as shown in FIG. 6 (in this particular case, the curve C) is input (Step $S_5$).

When all the input procedures are completed, the CPU 100 computes the density values corresponding to the variation of the mediate value l (Step $S_6$), and then inputs the values to the RAMs $17_{YD}$, $17_{KD}$, $7_{CD}$ and $17_{MD}$ with the corresponding values of the mediate value l being the storing addresses (Step $S_7$).

By carrying out the same procedure for the intervals $M_A$ to $M_B$, $M_B$ to $M_C$ and $M_C$ to $M_{max}$, all the data input data are shown together in Table 1.

It should be noted in this regard that when each of the distance data are input from the keyboard 101, the CPU 100 processes them by converting the same to the corresponding mediate value l.

TABLE 1

| Interval | Step $S_2$ | $S_4$ | $S_5$ |
|---|---|---|---|
| $M_0$-$M_Z$ | Densities at $M_0$<br>Y = 0, K = 0<br>C = 100, M = 0 | Densities at $M_A$<br>Y = 100, K = 0,<br>C = 0, M = 40 | Y = $C_2$<br>C = $C_2$<br>M = $C_1$ |
| $M_A$-$M_B$ | Densities at $M_A$<br>Data input in<br>Step $S_4$ is<br>used | Densities at $M_B$<br>Y = 100, K = 60,<br>C = 0, M = 100 | Y = $C_1$ ($C_2$)<br>K = $B_1$<br>M = $B_1$ |
| $M_B$-$M_C$ | Densities at $M_B$<br>Data input in<br>Step $S_4$ is<br>used | Densities at $M_C$<br>Y = 0, K = 100,<br>C = 0, M − 0 | Y = $D_2$<br>K = $D_1$<br>M = $D_2$ |
| $M_C$-$M_{ma}$ | Densities at $M_C$<br>Data input in<br>Step $S_4$ is<br>used | Densities at<br>$M_{max}$<br>Y = K = C = M<br>= 0 | |

It should be noted that instead of the output from the frequency divider $11_{D-2}$ in FIG. 9, the output of the encoder 2 (or a signal obtained by multiplying the frequency of the same) can be used.

Figure 12:
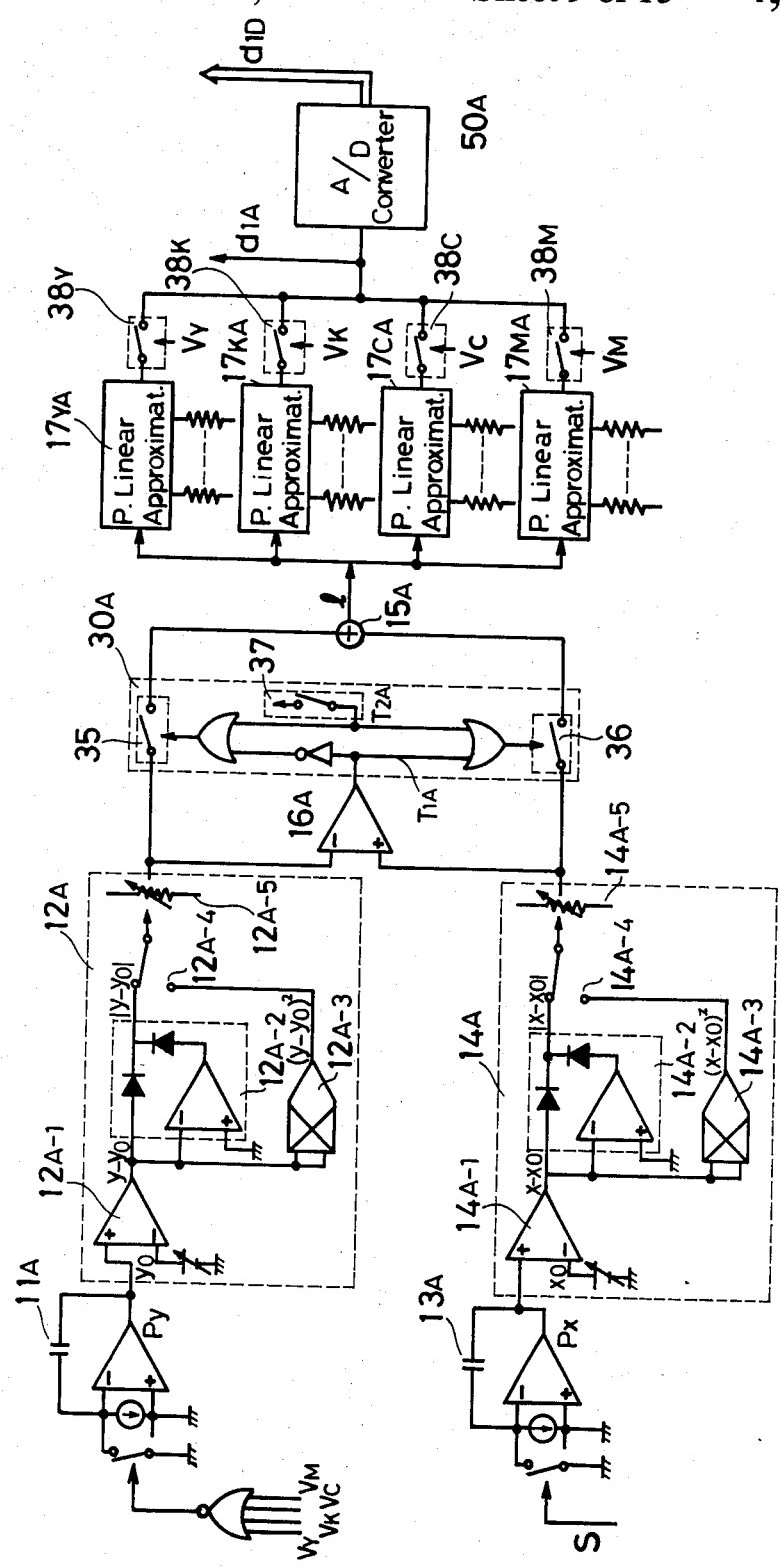
FIG. 12 is a block diagram of an analog data processing portion of the apparatus of FIG. 7.

FIG. 12 shows another embodiment of the present invention. Since the embodiment of FIG. 12 is an analog version of the data processing portion of the apparatus of FIG. 7, each component shown in FIG. 12 has the same number as its counterpart in FIG. 7 with a suffix A attached, by which the functional correspondence between the two is clarified.

When one of the said color separations $V_Y$, $V_K$, $V_C$ and $V_M$ respectively corresponding to the color separations Y, K, C and M becomes "H", a y coordinate value signal $P_y$ is obtained from an integration circuit $11_A$. The y coordinate value signal $P_y$ is input to a differential amplifier $12_{A-1}$ composing a main scanning function generator $12_A$. A signal representing a value $y - y_0$ output from a differential amplifier $12_{A-1}$ is converted into a signal representative of an absolute value $|y-y_0|$ by an absolute value producer $12_{A-2}$.

In the meantime, the value $y - y_0$ is also input to a squaring circuit $12_{A-3}$ to be squared. A proper one of the absolute value $|y-y_0|$ and the square value $(y-y_0)^2$ corresponding to a selected density distribution pattern is selected by a switch $12_{A-4}$, and then multiplied by a coefficient b by means of a variable resistor $12_{A-5}$ to be $b|y-y_0|$ or $b(y-y_0)^2$ representing the function g(y).

On the other hand, an integration circuit $13_A$, which operates in synchronism with input of the start pulse signal S thereto, outputs an x coordinate value signal $P_x$ corresponding to the position of the recording head in the sub-scanning direction to a sub-scanning function generator $14_A$. The function generator $14_A$ has the same function of the function generator $12_A$; therefore, a function f(x) can be obtained by means of a variable resistor $14_{A-5}$. It should be noted incidentally that one of the resistors $12_{A-5}$ and $14_{A-5}$ can be a fixed resistor, when only the other variable resistor is used for controlling the coefficient.

The thus-obtained functions g(y) and f(x) are summed by means of switches 35 and 36 of a switching circuit $30_A$ to produce the coordinate value l.

The functions f(x) and g(y) are also input to a comparator $16_A$ which outputs a control signal $T_{1A}$ of "L" for the switching circuit $30_A$, mentioned in detail, below when the value of the function g(y) is greater than that of the function f(x). The switching circuit $30_A$, constructed and used same as the switching circuit $30_D$, outputs the value similarly the function g(y) by closing the switch 35 when the control signal $T_{1A}$ is "L", or outputs the value of the function f(x) by closing the switch 36 when the control signal $T_{1A}$ is "H". When any density distribution pattern other than the rectangular pattern is to be formed, the control signal $T_{2A}$ becomes "H" and the switches 35, 36 and 37 are closed to output the values of both the functions g(y) and f(x).

Figure 17:
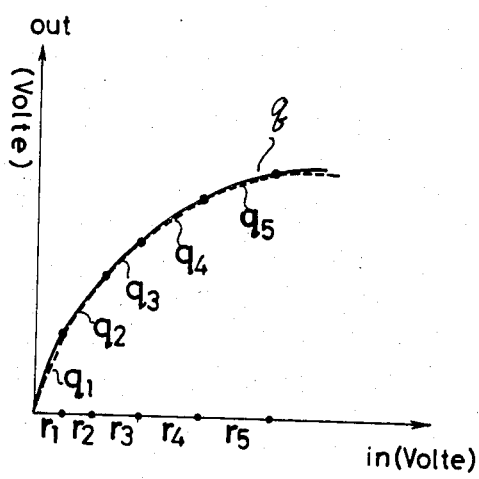
FIG. 17 is a graph of a curved transfer function produced by piecewise linear approximation circuits.

The values of the functions f(x) and g(y) from the switching circuit $30_A$ are summed in an adder $15_A$ to produce a mediate value l. The mediate value l is input to conventional piecewise linear approximation circuits $17_{YA}$, $17_{KA}$, $17_{CA}$ and $17_{MA}$ provided respectively for the Y, K, C and M color separations. Each of the piecewise linear approximation circuits $17_{YA}$, $17_{KA}$, $17_{CA}$ and $17_{MA}$ is capable of outputting a piecewise linear approximation of a curve composed of seriated short straight segments as shown by several characteristic curves in FIG. 6. In a conventional piecewise linear approximation circuit, a curve q representing a transfer function is replaced with straight lines q1, q2, . . . which correspond to sections $r_1$, $r_2$, . . . on the input side together approximating a curve q, to obtain such an input-output characteristic as shown in FIG. 17. The range of the sections as well as the grade of the straight lines are selectable; consequently curves of larger curvatures are able to be simulated by making use of finer input sections. A piecewise linear approximation circuit of this type is discussed in detail in the June 1983 issue of Transistor Gijutsu (a Japanese monthly magazine); therefore, detailed disclosure thereof is not provided herein. Analog output signals $d_{1A}$ of the piecewise linear approximation circuits $17_{YA}$, $17_{KA}$, $17_{CA}$ and $17_{MA}$ are input to the beam modulator 20 respectively by way of switches $38_Y$, $38_K$, $38_C$ and $38_M$, each of which is closed when the corresponding color separation recording signal is "H". When the halftone dot generator 21 is used instead, the analog output signals $d_{1A}$ are converted into corresponding digital signals $D_{1D}$ by an A/D converter $50_A$ before being input to the beam modulator 20.

Although the descriptions of the above two embodiments are based on a provision that four color separations Y, K, C and M are recorded successively in one revolution of the recording drum, either of the two embodiments is, of course, capable of recording one or two of the color separations in one revolution of the recording drum by selectively using a color separation recording signal W output once each revolution of the recording drum as shown in FIG. 8(g), or a color separation recording signal $V_Y V_C$ or $V_K V_M$, as shown in FIGS. 8(h) and 8(i).

Figure 13:
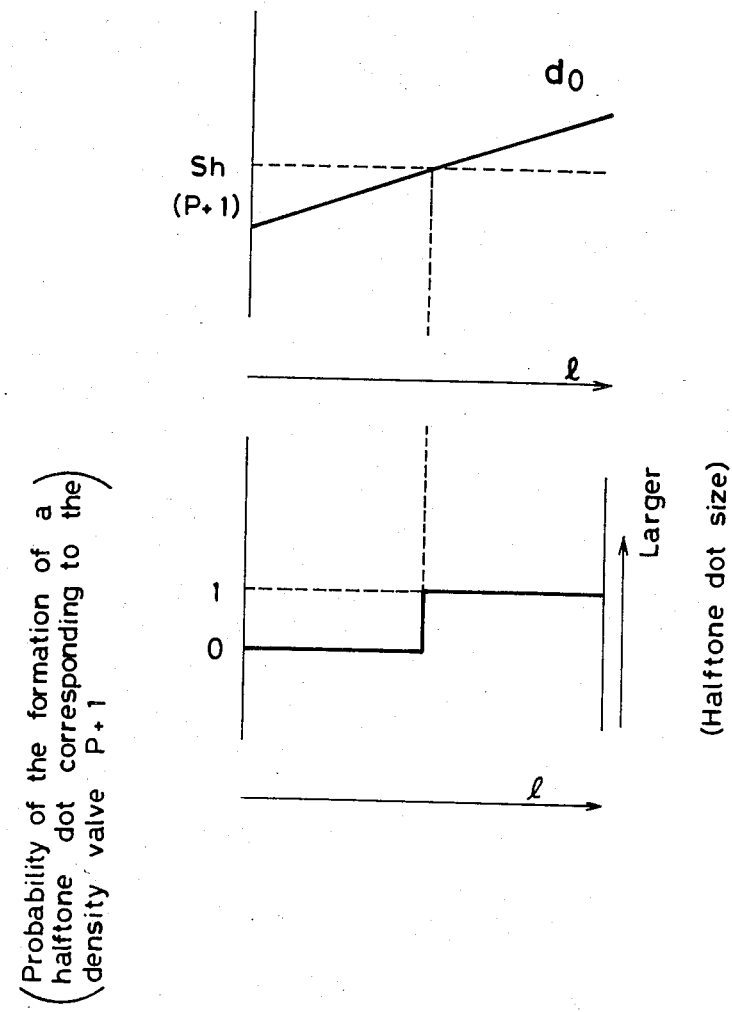
FIG. 13 is a graph of the relations among threshold levels of a halftone dot generator, the mediate value and the size of a corresponding halftone dot.
Figure 14:
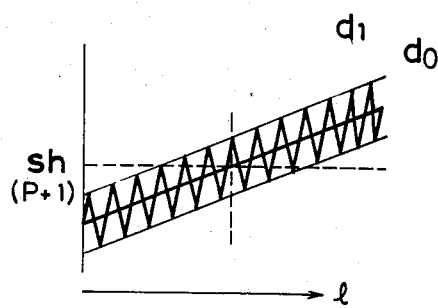
FIG. 14 is a graph of the relations among threshold levels of a halftone dot generator, the mediate value and the size of a corresponding halftone dot when a modulation signal is superimposed on a signal representative of the mediate value.
Figure 14:
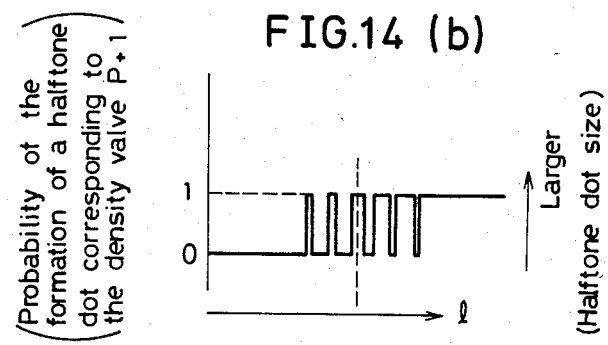
Figure 14:
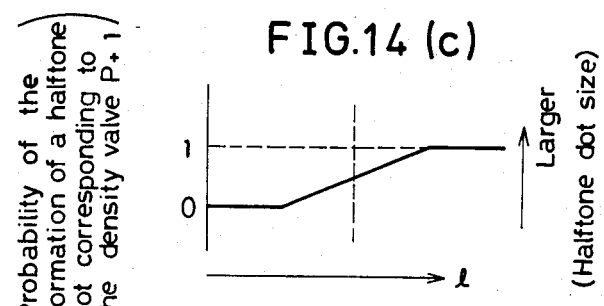
Figure 15:
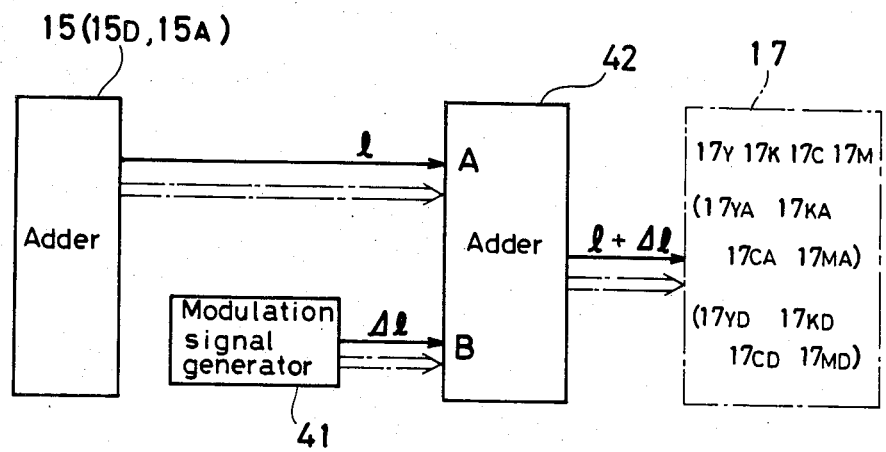
FIG. 15 is a diagram of modulation signal superimposing circuitry employed in the invention.

In each of the above two embodiments, when a digital halftone dot generator is used, the variation of the density value $d_0$ output from the density signal generator is as shown in FIG. 13(a), whereas an output signal of the halftone dot generator is stepped with respect to a specific value of the density value $d_0$ as shown in FIG. 13(b), owing to error produced in the digitizing process. More precisely, when the density value $d_0$ is between a threshold level $Sh_{(P)}$ corresponding to a density value P and a threshold level $Sh_{(P+1)}$ corresponding to a density value P+1, a halftone dot corresponding to the density value P is formed. When the density value $d_0$ is above the threshold level $Sh_{(P+1)}$, a halftone dot corresponding to the density value P+1 is formed. Therefore, by modulating the mediate value with a modulation signal Δl (for instance, a saw-tooth or triangular wave) by means of a circuit as shown in FIG. 15 provided behind the adder 15, a density signal $d_4$ is shown in FIG. 14(a) can be obtained. In response, a halftone dot corresponding to the density P+1 as shown in FIG. 14(b) is output, and the probability of the formation of a halftone can be gradually increased as shown in FIG. 14(c) so as to avoid the above phenomenon.

FIG. 15 shows a well-known modulation signal superimposing circuit, in which a modulation signal generated by the modulation signal generator 41 is imposed by an adder 42 on the mediate value output from the adder 15 ($15_D$ or $15_A$).

Figure 16:
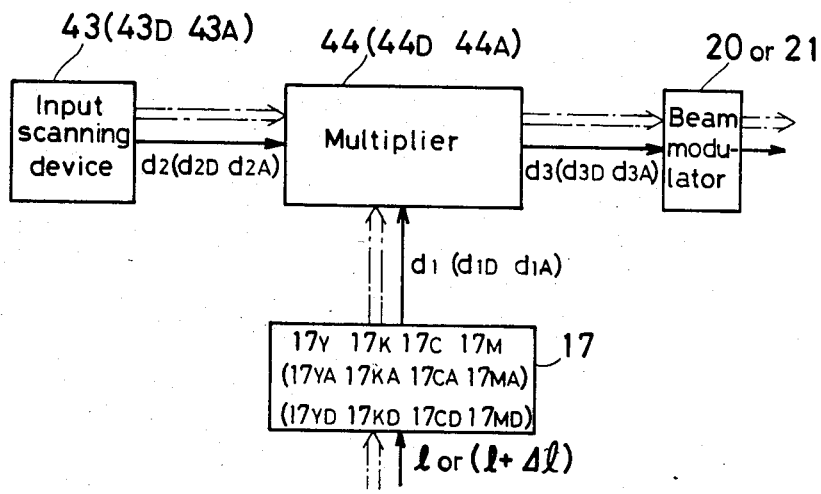
FIG. 16 is a diagram of a circuitry for superimposing a signal representative of a density distribution pattern on a signal obtained by scanning an original subjected to image reproduction.

The present invention can be applied electronically to reproducing images by means of circuitry as shown in FIG. 16 employing in an image reproduction system.

Specifically, by multiplying the image signal $d_2$ ($d_{2A}$, $d_{2D}$) obtained from an input scanning device 43 ($43_A$, $43_D$) by a density signal $d_1$ ($d_{1A}$, $D_{1D}$) obtained from the density signal generators $17_Y$, $17_K$, $17_C$ and $17_M$ (the RAMs $17_{YD}$, $17_{KD}$, $17_{CD}$ and $17_{MD}$, and the piecewise linear approximation circuits $17_{YD}$, $17_{KD}$, $17_{CD}$ and $17_{MD}$) by means of analog or digital multipliers 44 ($44_A$, $44_D$) as shown in FIG. 7 (9 or 12), an image signal $d_3$ ($d_{3A}$, $d_{3D}$) representative of a specific density distribution pattern as shown in FIGS. 1 through 5 can be obtained, by which signal the pattern can be formed on a reproduction image.

As mentioned above, the present invention capable of obtaining a density signal corresponding to a mediate value l expressed by an equation $l=f(x)+g(y)$ representing a specific pattern on a coordinate system (x, y) is applicable to producing a halftone dot film in which a density distribution of a specific pattern such as a circle, oval, and rhombus varied according to the mediate value l (corresponding to a distance of a point from the center of each pattern) is formed. Therefore, a print in which a density distribution of a specific pattern varied in accordance with the distance from the center of symmetry of the pattern is formed by using the above halftone dot film. Furthermore, a print on which a specific color or tint gradation varied in accordance with the distance from the center of symmetry of the above specific pattern is formed can be obtained by using Y, K, C and M halftone dot films of specific density gradation.

Otherwise, the above effects can be imposed on a reproduction image by multiplying an image signal obtained from an input scanning device of an image reproduction system by the above density signal.

In this disclosure, there is shown and described only the preferred embodiment of the invention, but as aforementioned, it is to be understood that the invention is capable of use in various other combinations and environments and is capable of changes or modifications within the scope of the inventive concept as expressed herein.

We claim:

1. A method of forming a halftone dot on a photosensitive material in correspondence with a density value to be recorded thereon in an image reproduction system, comprising the steps of:
    (a) obtaining a signal representative of main scanning (y) and sub-scanning (x) direction coordinate values of a recording position on the photosensitive material;
    (b) generating signals representative of functions f(x) and g(y) composing an equation $l=f(x)+g(y)$ corresponding to a specific figure in accordance with said coordinate value signals, where l is a mediate value;
    (c) obtaining the mediate value l by summing the values of the functions f(x) and g(y); and
    (d) generating a density signal representative of a density value to be recorded corresponding to said mediate value l.

2. A method of forming a halftone dot on a photosensitive material in correspondence with a density value to be recorded thereon in an image reproduction system, comprising the steps of:
    (a) obtaining a signal representative of main scanning (y) and sub-scanning (x) direction coordinate values of a recording position on the photosensitive material;
    (b) generating signals representative of functions f(x) and g(y) composing an equation $l=f(x)+g(y)$ corresponding to a specific figure in accordance with the said coordinate value signals, where l is a mediate value;
    (c) obtaining the mediate value l by summing the values of the functions f(x) and g(y);
    (d) generating a density signal representative of a density value corresponding to said mediate value l; and
    (e) generating a signal representative of a density value to be recorded by superimposing the said density signal on an image signal obtained by scanning an original.

3. A method as recited in claim 1 or 2 including modulating the signal representative of the mediate value l by a modulation signal $\Delta l$.

4. A method as recited in claim 1 or 2 in which the two functions f(x) and g(y) are expressed by equations:

$$\begin{cases} f(x) = a|x - x_0| \\ g(y) = 0 \end{cases}$$

or $$\begin{cases} f(x) = 0 \\ g(y) = b|y - y_0|, \end{cases}$$

when the mediate value l corresponds to a lengthwise fringe or a sidewise fringe.

5. A method as recited in claim 1 or 2 in which the two functions f(x) and g(y) are expressed by equations:

$$\begin{cases} f(x) = a|x - x_0|, \text{ where } (a > 0) \\ g(y) = b|y - y_0|, \text{ where } (b > 0), \end{cases}$$

when the mediate value l corresponds to a rhombus.

6. A method as recited in claim 1 or 2 in which the two functions f(x) and g(y) are expressed by equations:

$$\begin{cases} f(x) = a(x - x_0)^2, \text{ where } (a > 0) \\ g(y) = b(y - y_0)^2, \text{ where } (b > 0), \end{cases}$$

when the mediate value l corresponds to a circle or oval.

7. A method as recited in claim 1 or 2 in which the two functions f(x) and g(y) are expressed by equations:

$$\begin{cases} f(x) = a(x - x_0)^2, \text{ where } (a > 0) \\ g(y) = b|y - y_0|, \text{ where } (b > 0), \end{cases}$$

when the mediate value l corresponds to a parabola.

8. A method as recited in claim 1 or 2 in which the two functions f(x) and g(y) are expressed by the one of the following two pairs of equations that produces the greater mediate value l:

$$\begin{cases} f(x) = a|x - x_0|, \text{ where } (a > 0) \\ g(y) = 0 \end{cases}$$

and $$\begin{cases} f(x) = 0 \\ g(y) = b|y - y_0|, \text{ where } (b > 0), \end{cases}$$

when the mediate value l corresponds to a rectangle.

9. A method as recited in claim 1 or 2 including varying the density corresponding to that of the mediate value l for each of the color separations Y (Yellow), K (Black), C (Cyan) and M (Magenta) so that a desired color or tint gradation is formed when the four color separations in combination are used to produce a print.

10. An apparatus for forming a halftone dot on a photosensitive material by means of a halftone dot generator in correspondence with a density value to be recorded thereon in image reproduction, comprising:
    (a) coordinate value signal generation means for obtaining a signal representative of main scanning (y) and sub-scanning (x) direction coordinate values of a recording position on the photosensitive material;
    (b) function signal generation means for generating signals representative of functions f(x) and g(y) composing an equation $l=f(x)+g(y)$ corresponding to a specific figure in accordance with the said coordinate value signals, where l is a mediate value;

(c) summing means for summing the values of the functions f(x) and g(y) to obtain the mediate value l; and (d) density signal generation means for outputting a density signal representative of a density value corresponding to the said mediate value l to the said halftone dot generator.

11. An apparatus for forming a halftone dot on a photosensitive material by means of a halftone dot generator in correspondence with a density value to be recorded thereon in reproducing images comprising:

(a) coordinate value signal generation means for obtaining a signal representative of main scanning (y) and sub-scanning (x) direction coordinate values of a recording position on the photosensitive material;

(b) function signal generation means for generating signals representative of functions f(x) and g(y) composing an equation $l = f(x) + g(y)$ corresponding to a specific figure in accordance with the said coordinate value signals, where l is a mediate value;

(c) summing means for summing the values of the functions f(x) and g(y) to obtain the mediate value l;

(d) density signal generation means for generating a density signal representative of a density value corresponding to said mediate value l; and (e) multiplier means for multiplying an image signal obtained by scanning an original by the said density signal output from the density signal generation means to output a multiplication resultant to said halftone dot generator.

12. An apparatus as recited in claim 10 or 11 in which the function signal generation means comprises:

(a) a first function signal generator for generating a signal representative of a value of the function g(y) in response to an input of a signal representative of the main scanning (y) coordinate value thereto;

(b) a second function signal generator for generating a signal representative of a value of the function f(x) in response to input of a signal representative of the subscanning (x) coordinate value thereto;

(c) a comparator for comparing the value output from the first function generator and that of the second function generator; and (d) a switch responsive to the comparator for applying one of the signals output from the first and the second function generators to an adder.

13. An apparatus as recited in claim 12 in which the first function generator comprises:

(a) a computation means for computing the value of the function g(y) corresponding to a y coordinate value and the value of the function f(x) corresponding to an x coordinate value by inputting thereto the coordinate value $(x_0, y_0)$ of the origin, a density distribution pattern and coefficients included in the functions g(y) and f(x);

(b) a first function memory for storing the value of the function g(y) with the y coordinate value being the storage address; and (c) a second function memory for storing the value of the function f(x) with the x coordinate value being the storage address.

14. An apparatus as recited in claim 12 in which the first function signal generator comprises:

(a) a subtractor for subtracting the y coordinate value $y_0$ of the origin from the coordinate value y, to output the value $y - y_0$;

(b) an absolute value generator for developing the absolute value of the output of the said subtractor;

(c) a square value generator for developing the square value of the output of the said subtractor;

(d) a switch for choosing between the absolute value and the square value; and (e) a multiplier for multiplying the output of the switch by a coefficient;

and the second function signal generator comprises:

(f) a subtractor for subtracting the x coordinate value $x_0$ of the origin from the coordinate value x, to output the value $x - x_0$;

(g) an absolute value generator for outputting the absolute value of said subtractor;

(h) a square value generator for obtaining the square of the output of the said subtractor;

(i) a switch for choosing between the absolute value and the square value; and (j) a multiplier for multiplying the output of the switch by a coefficient.

15. An apparatus as recited in claim 10 or 11 in which the density signal generation means comprises:

(a) a computation means for comprising the density variation corresponding to that of the mediate value l for each of the color separations, Y, K, C and M by inputting thereto the coordinate value of the origin, the main or subscanning direction coordinate value of no less than one point, of the object density values of the color separations Y, K, C and M of several points of the object and the density variation between the points; and (b) a plurality of memories for storing the density values of the color separations Y, K, C and M obtained by the computation means, the corresponding variations of the mediate value l being the storage addresses.

16. An apparatus as recited in claim 10 or 11 in which the density signal generation means includes piecewise linear approximation circuits, each of which outputs a signal representative of a piecewise approximation composed of seriated short straight segments corresponding to a curve.

* * * * *